United States Patent

Fitzgerald, Jr.

[15] 3,641,398

[45] Feb. 8, 1972

[54] HIGH-FREQUENCY SEMICONDUCTOR DEVICE

[72] Inventor: William Vincent Fitzgerald, Jr., Basking Ridge, N.J.

[73] Assignee: RCA Corporation

[22] Filed: Sept. 23, 1970

[21] Appl. No.: 74,591

[52] U.S. Cl. ........................................317/234 G, 317/234 G
[51] Int. Cl. ............................................................H01l 1/14
[58] Field of Search ..................................................317/234

[56] References Cited

UNITED STATES PATENTS 3,478,161 11/1969 Carley ....................................174/52
3,449,640 6/1969 Franklin ..............................317/234
3,387,190 6/1968 Winkler ...............................317/234

*Primary Examiner*—John W. Huckert
*Assistant Examiner*—E. Wojciechowicz
*Attorney*—Glenn H. Bruestle

[57] ABSTRACT

The device envelope comprises a plurality of members, some of which are electrically conductive, and others of which are electrically insulating, the various members being in stacked relationship, and some of the conductive members serving as device terminals. The various members are brazed to one another, the brazed joints on opposite surfaces of each of the insulating members not overlapping.

6 Claims, 4 Drawing Figures

INVENTOR.
William V. Fitzgerald, Jr.
BY M. Y. Epstein
ATTORNEY

INVENTOR.
William V. Fttzgerald, Jr.
BY M.Y. Epstein
ATTORNEY

HIGH-FREQUENCY SEMICONDUCTOR DEVICE

BACKGROUND OF THE INVENTION

This invention relates to semiconductive devices, and particularly to semiconductor devices having utility at high frequencies.

Certain types of high-frequency semiconductor devices comprise a semiconductor pellet enclosed within an envelope including a plurality of stacked electrically conductive members and a plurality of electrically insulative members, the conductive and insulative members alternating with one another. The various members are bonded to one another by means of brazed joints. Some of the conductive members serve as device terminals.

For efficient use of such devices at high frequencies, it is desirable that the interterminal capacitances of the devices be as low as possible. A problem associated with devices of the type described, however, is that the insulating members and the brazed joints on opposite surfaces thereof comprise capacitors providing capacitive coupling between the device terminals brazed to the opposite sides of the insulating members. Reduction of this capacitive coupling would result in better high-frequency devices.

DESCRIPTION OF A PREFERRED EMBODIMENT OF THE INVENTION

Figure 1:
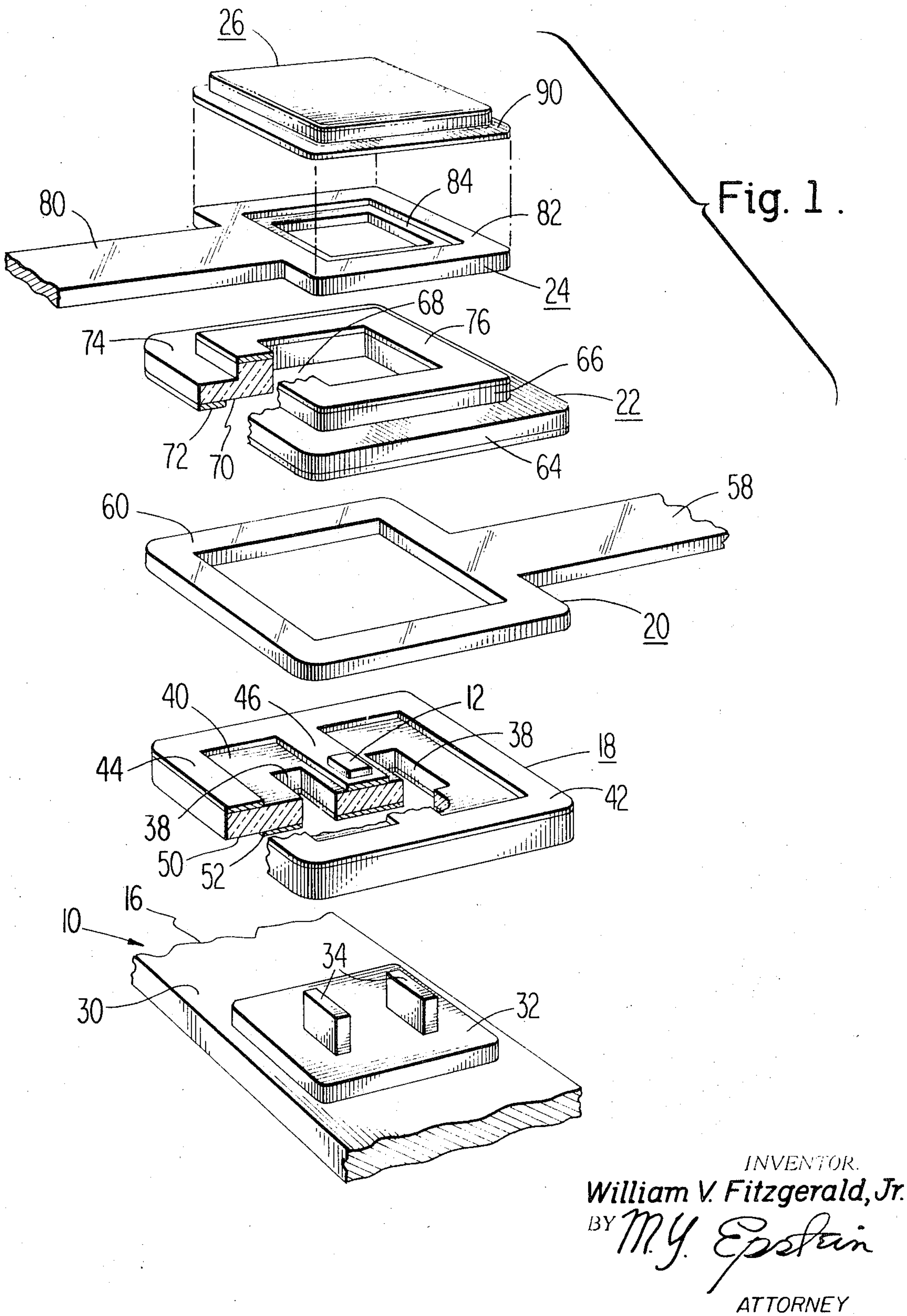
FIG. 1 is an exploded view, partly sectioned, of portions of a high-frequency device made in accordance with the instant invention.
Figure 2:
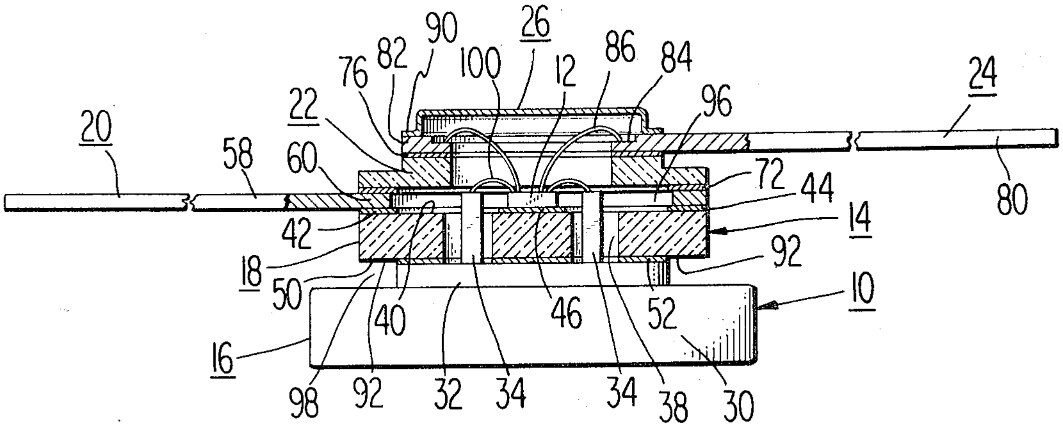
FIG. 2 is a cross-sectional view of a complete device made in accordance with the instant invention, the device being rotated 180° from the position thereof shown in FIG. 1.

With reference to FIGS. 1 and 2, a device 10 is shown comprising a semiconductor pellet 12 mounted within an enclosure or envelope 14 comprising, in the order named, a metallic base flange 16 of metal, e.g., copper, a flat spacer 18 of a high thermal conductivity insulating material, e.g., beryllia ceramic, a first terminal lead 20 of metal, e.g., copper, a stepped spacer 22 of insulating material, e.g., alumina ceramic, a second terminal lead 24 of metal, e.g., copper, and a top cap 26 of metal, e.g., nickel.

The device 10 is operable at high frequencies, e.g., in excess of 3 gHz.

The base flange 16 comprises a flat substrate 30 having, integral therewith, a plate or platform 32, and a pair of pedestals 34 extending upwardly from the platform.

The flat spacer 18 has a pair of slots 38 therethrough. The upper surface 40 of the spacer 18 is provided with a thin layer 42 of metal, e.g., a 0.5-mil-thick layer of molybdenum provided by known metallizing techniques. As shown in FIG. 1, the layer 42 is patterned in the form of a square ring 44 along the outer edge of the spacer 18 and a central extension 46 extending between the slots 38.

Figure 3:
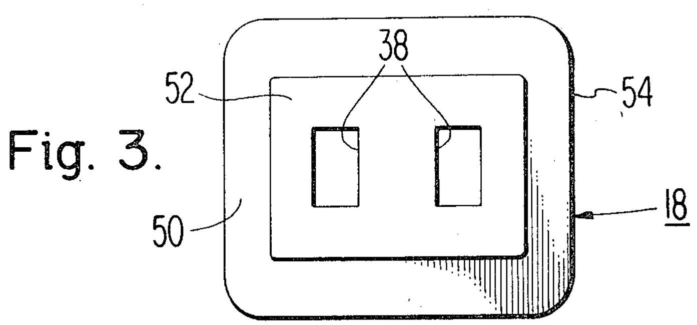
FIGS. 3 and 4 are bottom views of two of the envelope members shown in FIG. 1.

The lower surface 50 (FIG. 3) of the spacer 18 is also provided with a patterned metallic layer 52 of, e.g., molybdenum. As shown, the layer 52 surrounds the slots 38 but is spaced from the outer edge 54 of the spacer 18 by a distance, as shown in FIGS. 1 and 2, sufficient to prevent overlapping of the layer 52 with the ring portion 44 of the metallic layer 42 on the upper surface 40 of the spacer. That is, a projection of the metal ring portion 44 does not intersect the layer 52.

An advantage of the nonoverlapping metal layer arrangement shown is that the capacitor formed by the combination of insulating material spacer 18 and the metal layers 42 and 52 on opposite surfaces thereof is significantly smaller than the capacitor that would be formed if the metal layers 42 and 52 fully overlapped one another.

The first terminal 20 comprises an elongated lead portion 58 and a square ring portion 60.

Figure 4:
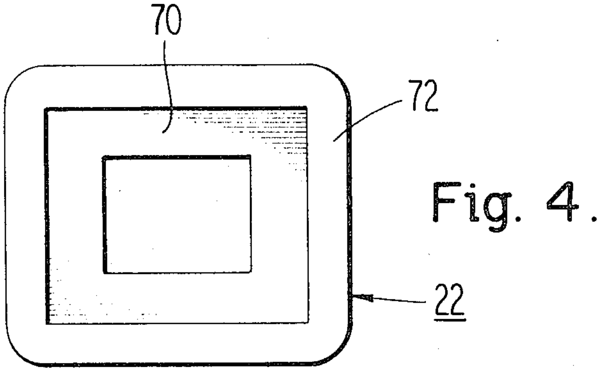

The stepped spacer 22 comprises a plate 64 and a central platform 66 integral therewith. A square, centrally located opening 68 extends through the spacer 22. The lower surface 70 of the spacer 22 has, as shown in FIG. 4, a layer 72 of metal, e.g., molybdenum, in the shape of a square ring disposed along the outer edge of the spacer. The upper surface (FIG. 1) of the spacer platform 66 is provided with a layer 76 of metal, e.g., molybdenum. As shown in FIGS. 1 and 2, the metal layer 76 does not overlap the metal layer 72 on the under surface of the plate 64.

The capacitance of the capacitor formed by the metal layers 72 and 76 and the insulating member therebetween is small owing to the lack of overlap between the two metal layers. Also, owing to the stepped configuration of the spacer 22, whereby an airgap is substituted for insulating material, the capacitance between the layers 72 and 76 is further reduced.

The second terminal 24 comprises an elongated lead portion 80 and a square ring portion 82. The inside of the ring portion 82 is provided with a recessed ledge 84 to which connector lead wires 86 (FIG. 2) are bonded from the semiconductor pellet 12.

The top cap 26 comprises a cup-shaped member having a peripheral flange 90.

The device 10 is assembled as follows. First, the base flange 16, the flat spacer 18, the first terminal 20, the stepped spacer 22, and the second terminal 24 are assembled, in the named order, in coaxial stacked relationship, and brazed together to form a rigid assembly. A 72 percent silver—28 percent copper, by weight, braze material, for example, can be used, the braze material rigidly adhering to the various metallized surfaces of the two insulating spacers 18 and 22, while not spreading along the unmetallized portions of the insulating spacers.

The two pedestals 34 on the base flange platform 32 each extend upwardly through a different one of the two slots 38 through the flat spacer 18, the pedestals not contacting the spacer 18.

As shown in FIG. 2, the ring portion 60 of the first terminal 20 is of small cross-sectional area, in comparison with the cross-sectional area of the two spacers 18 and 22, whereby an open gap 96 is provided between the two spacers. This open gap 96, of low dielectric constant, further reduces the capacitive coupling between the device terminals. Likewise, the platform 32 on the base flange 16 is smaller than the spacer 18, whereby the spacer 18 overhangs the platform 32, providing an airgap 98 between the ring portion 44 of the metal layer 42 on the spacer 18 and the flat substrate 30 of the base flange 16. This further reduces the capacitive coupling between the terminal 20 and the base flange 16.

The semiconductor pellet 12, of known type, e.g., a transistor having emitter, base, and collector electrodes, is then brazed to the central metallized extension 46 on the upper surface 40 of the flat spacer 18. The transistor collector electrode is electrically connected to the lower surface of the pellet 12, whereby the collector electrode is electrically connected to the first terminal 20 via the metal layer 42 of the space 18 and the brazed joint between the ring portion 44 of the layer 42 and the ring portion 60 of the terminal 20.

Fine wires 100 (FIG. 2) are then bonded between the base electrode of the transistor pellet 12 and the pedestals 34 on the base flange 16, the base flange 16 thus serving as the base terminal of the device. An advantage of the use of the pedestals 34 is that only relatively short wires 100 are required to connect the transistor base electrode to the base flange 16, whereby, owing to the comparatively large cross section of the pedestals 34, good heat transfer from the pellet to the device base terminal is provided. Also, owing to the large cross section of the pedestals 34, the device base terminal has low inductive impedance.

Fine wires 86 are also bonded between the emitter electrode of the pellet 12 and the recessed ledge 84 of the second lead 24.

To complete the device, the peripheral flange 90 of the top cap 26 is welded to the upper surface of the ring portion 82 of the second lead 24.

As previously noted, owing to the offset relationship of the brazed joints on the opposite surfaces of each of the insulative spacers 18 and 22, the amount of offset being such that, preferably, the joints are completely nonoverlapping, and the provision of gaps between various ones of the envelope members, the capacitive coupling through the insulative members is significantly reduced. Since a device terminal member is electrically connected to opposite sides of each of the insulative members, the capacitive coupling between the electrode terminals is also reduced. In comparison with the prior art devices, for example, having various envelope members similar to the herein described envelope members but containing overlapped brazed joints, the interterminal capacitance is reduced by an amount in the order of 60 percent.

I claim:

1. A semiconductor device comprising:
an envelope comprising at least three electrically conductive plates and a first electrically insulating member, two of said conductive plates sandwiching said insulating member therebetween,
said two conductive plates comprising terminals of said device and being bonded to opposite sides of said insulating member by means of brazed joints, there being substantially no overlapping of said joints; and
a semiconductor pellet within said envelope, a portion of said pellet electrically connected to one of said two conductive plates.

2. A device a in claim 1 wherein:
one of said plates has a pedestal extending therefrom,
said first insulating member has a pair of surfaces and an opening therethrough between said surfaces,
said insulating member is mounted on said plate with one of said surfaces engaged therewith and said pedestal extending through said opening, and including
said semiconductor pellet mounted on the other of said surfaces of said insulating member next adjacent said pedestal, and
connector means electrically connecting said portion of said pellet with said pedestal.

3. A device as in claim 2 wherein:
said plate is mounted on a substrate having a cross-sectional area larger than that of said plate, and
said first insulating member has a larger cross-sectional area than that of said plate, thereby overhanging said plate and providing an open gap between said insulating member and said substrate.

4. A device as in claim 2 including:
a layer of metal on said other surface of said first insulating member,
said pellet being bonded to said metal layer, and one of
the other of said plates being bonded to said first insulating member and being electrically connected to said pellet by means of said metal layer.

5. A device as in claim 5 including:
a second insulating member,
said first and second insulating members sandwiching said other plates therebetween and being bonded to opposite sides thereof, and
the cross-sectional area of said other plate being smaller than the cross-sectional area of the two insulating members bonded thereto, thereby providing an open gap between oppositely disposed electrically insulating surfaces of said two insulating members.

6. The high-frequency semiconductor device comprising:
first and second terminal plates;
first and second insulating members sandwiched between said first and second terminal plates;
a third terminal plate sandwiched between said insulating members;
a semiconductor pellet electrically connected to said first, second, and third terminal plates; and wherein
said first and second terminal plates do not overlap said third terminal plate.

* * * * *